United States Patent
Huang

(10) Patent No.: US 6,509,585 B2
(45) Date of Patent: Jan. 21, 2003

(54) ELECTROSTATIC DISCHARGE PROTECTIVE DEVICE INCORPORATING SILICON CONTROLLED RECTIFIER DEVICES

(75) Inventor: Chih-Yao Huang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/528,747

(22) Filed: Mar. 20, 2000

(65) Prior Publication Data

US 2002/0134990 A1 Sep. 26, 2002

(51) Int. Cl.⁷ .............................................. H01L 29/74
(52) U.S. Cl. ......................... 257/173; 257/355; 361/56
(58) Field of Search ................................. 257/355–363, 257/173, 107; 361/56

(56) References Cited

U.S. PATENT DOCUMENTS

| 5,182,220 A | * | 1/1993 | Ker et al. ...................... 437/34 |
| 5,268,588 A | * | 12/1993 | Marum ........................ 257/362 |
| 5,473,169 A | * | 12/1995 | Ker et al. .................... 257/173 |
| 5,751,525 A | * | 5/1998 | Olney .......................... 361/56 |
| 5,838,043 A | * | 11/1998 | Yuan ........................... 257/355 |
| 5,889,309 A | * | 3/1999 | Yu et al. ...................... 257/363 |
| 6,258,634 B1 | * | 7/2001 | Wang et al. ................. 438/133 |

FOREIGN PATENT DOCUMENTS

JP          59-4068         *   1/1984

OTHER PUBLICATIONS

Aoki, A Practical High–Latchup Immunity Design Methodology for Internal Circuits in the Standard Cell–Based CMOS/BiCMOS LSI's. IEEE vol. 40, No. 8, 8/93.

* cited by examiner

Primary Examiner—Tom Thomas
Assistant Examiner—Ori Nadav
(74) Attorney, Agent, or Firm—Raymond Sun

(57) ABSTRACT

An SCR cell structure provides a plurality of divided p+ and n+ blocks, and varies the spacing, sizes and locations of these divided p+ and n+ blocks to minimize latchup caused by non-ESD events. To further minimize latchup caused by non-ESD events, the SCR cell structure can also provide a plurality of divided blocks of Nwell and Psub pickup contacts, and varying the spacing, sizes, shapes and locations of these divided blocks of Nwell and Psub pickup contacts. In addition, the spacing of contact holes within the pickup contacts can also be varied to further minimize latchup caused by non-ESD events.

20 Claims, 6 Drawing Sheets

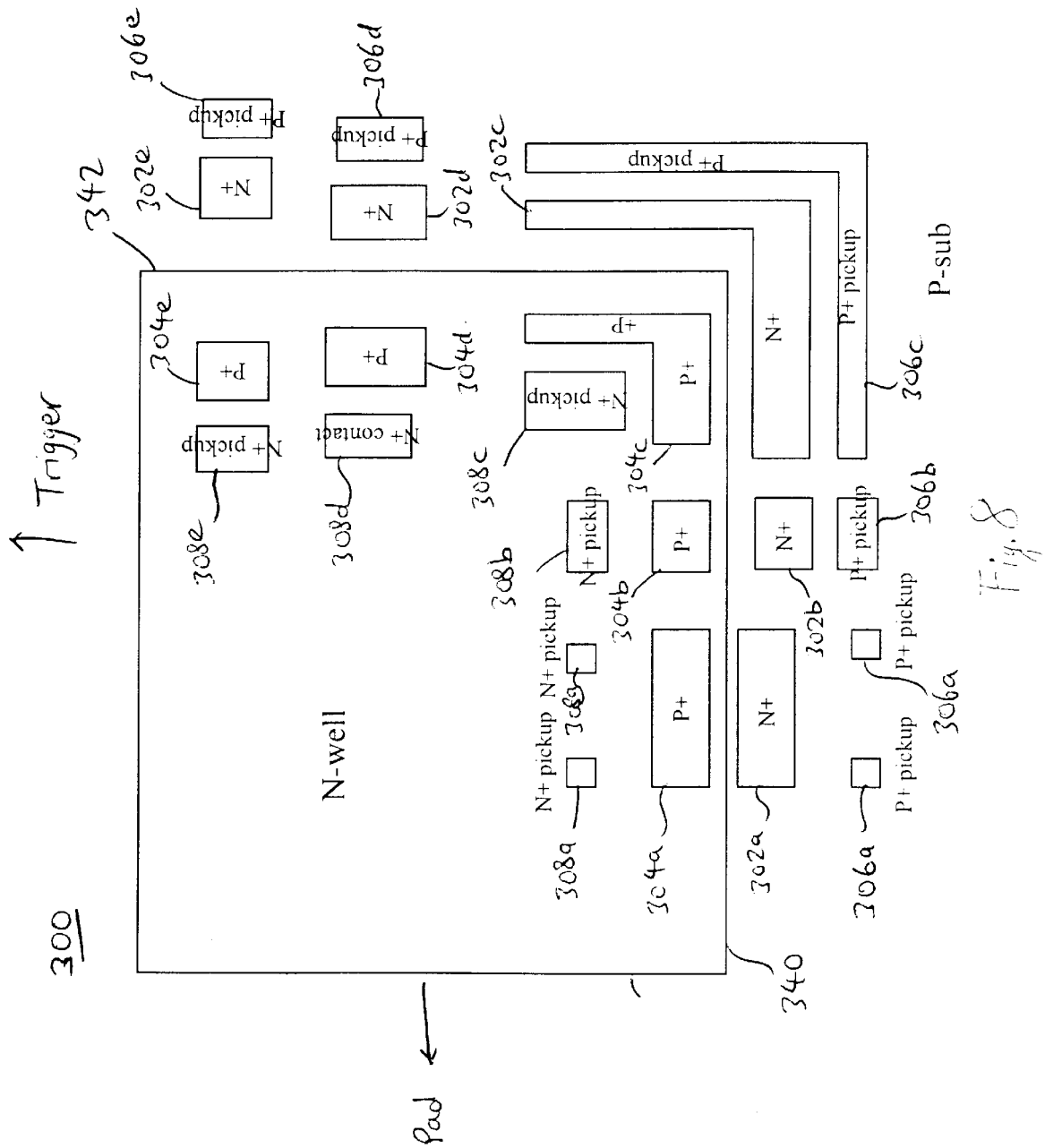

ELECTROSTATIC DISCHARGE PROTECTIVE DEVICE INCORPORATING SILICON CONTROLLED RECTIFIER DEVICES

BACKGROUND OF THE INVENTION

1. Field of the Invention

The present invention relates generally to electrostatic discharge (ESD) protection in integrated circuit (IC) packages, and more particularly, to the use of silicon controlled rectifier devices as ESD protective devices.

2. Background Art

Electrostatic discharge (ESD) is a movement of static electricity from a nonconductive surface, which could cause damage to semiconductors and other circuit components in ICs. A person walking on a carpet, for instance, can carry an amount of electrostatic charge up to several thousands of volts under high humidity conditions and over 10,000 volts under low humidity conditions. When touching ICs by hand, the instantaneous power level of the ESD could cause severe damage to the ICs. CMOS (complementary metal-oxide semiconductor) logic ICs are especially vulnerable to ESD.

To protect IC packages against ESD damage, various solutions have been proposed. One solution suggests the provision of an ESD protective device (also referred to herein as "ESD cell") between the internal semiconductor devices in the IC chip (hereinafter referred to as "internal circuit") and the corresponding bonding pad, as illustrated in FIG. 1. Under normal circumstances, the circuit in FIG. 1 operates as if the ESD cell is not present, so that the bonding pad directly couples the internal circuit. However, when a high voltage pulse (i.e., voltage in kvs) occurs, the ESD cell will shunt the current from the bonding pad away from the internal circuit, thereby protecting the internal circuit from damage.

Recently, silicon controlled rectifier (SCR) devices have been used as ESD cells because SCR devices can switch from very high impedance states to a very low impedance state. FIG. 2 illustrates a conventional SCR device, and FIG. 3 illustrates the voltage vs. current characteristics of a conventional SCR device. Referring to FIG. 3, the current rises very slowly as voltage increases, until the SCR device hits a switching voltage Vs. From Vs, the voltage decreases as the current rises slowly, until the SCR device reaches a "holding point" P. At this holding point P, the voltage will generally stay the same (or rise very slowly) even as the current increases drastically. As used herein, the term "latchup" means the part of the curve in FIG. 3 that is above the holding point P.

One significant drawback with the use of SCR devices as ESD cells is that SCR devices are susceptible to latchup caused by non-ESD events, such as other noise triggers. As a result, this susceptibility to latchup often requires further trade-offs in circuit design to optimize ESD robustness and latchup immunity.

Thus, there still remains a need for an SCR device that is capable of being used as an ESD cell, and where latchup of the SCR device caused by non-ESD events is minimized or eliminated.

SUMMARY OF THE INVENTION

It is an object of the present invention to provide an improved SCR device for use as an ESD cell.

It is another object of the present invention to provide an SCR device where latchup will only occur when ESD occurs.

In accordance with the foregoing and other objectives of the invention, the present invention provides an SCR cell structure that has a plurality of divided p+ and n+ blocks, with the spacing, sizes and locations of these divided p+ and n+ blocks being varied or adjusted to minimize latchup caused by non-ESD events. To further minimize latchup caused by non-ESD events, the SCR cell structure can also provide a plurality of divided blocks of Nwell and Psub pickup contacts, and varying the spacing, sizes, shapes and locations of these divided blocks of Nwell and Psub pickup contacts. In addition, the spacing of contact holes within the pickup contacts can also be varied to further minimize latchup caused by non-ESD events.

BRIEF DESCRIPTION OF THE DRAWINGS

The invention can be more fully understood by reading the subsequent detailed description of the preferred embodiments, with reference made to the accompanying drawings.

FIG. 8 is a layout schematic of an SCR cell structure used as an ESD protective device according to yet another embodiment of the present invention.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

The present invention provides an SCR cell structure that provides a plurality of divided p+ and n+ blocks, and varies the spacing, sizes and locations of these divided p+ and n+ blocks to minimize latchup caused by non-ESD events. To further minimize latchup caused by non-ESD events, the SCR cell structure can also provide a plurality of divided blocks of Nwell and Psub pickup contacts, and varying the spacing, sizes, shapes and locations of these divided blocks of Nwell and Psub pickup contacts. In addition, the spacing of contact holes within the pickup contacts can also be varied to further minimize latchup caused by non-ESD events.

Figure 1:
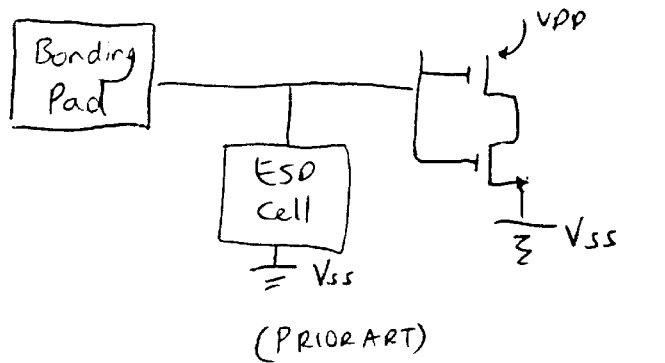
FIG. 1 illustrates the use of an ESD protective device between a bonding pad and an internal circuit.
Figure 2:
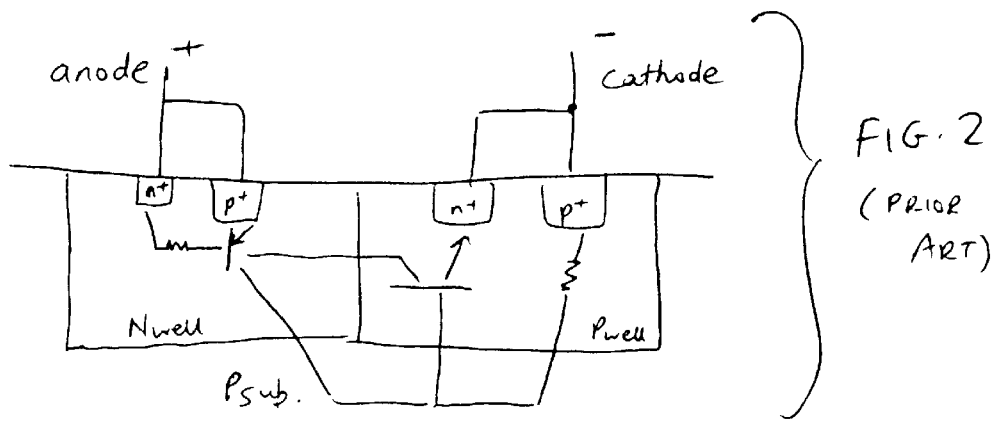
FIG. 2 illustrates a conventional SCR device.
Figure 3:
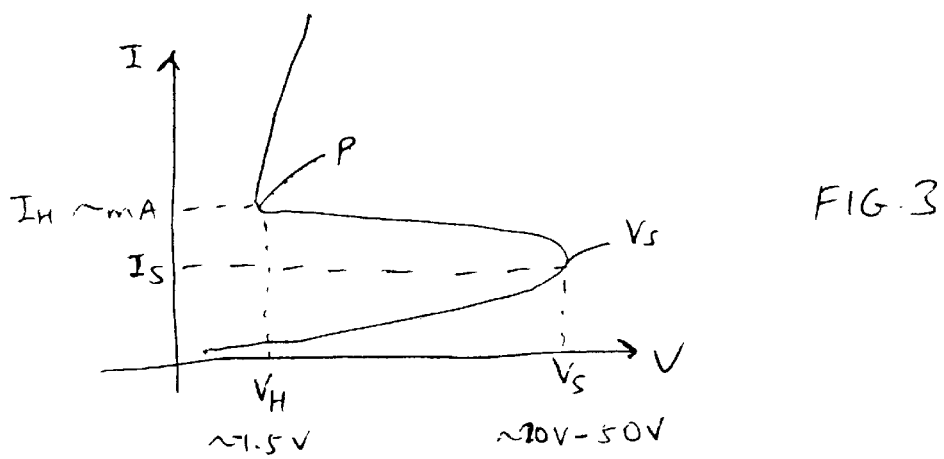
FIG. 3 is a graph illustrating the voltage vs. current characteristics of a conventional SCR device.
Figure 4:
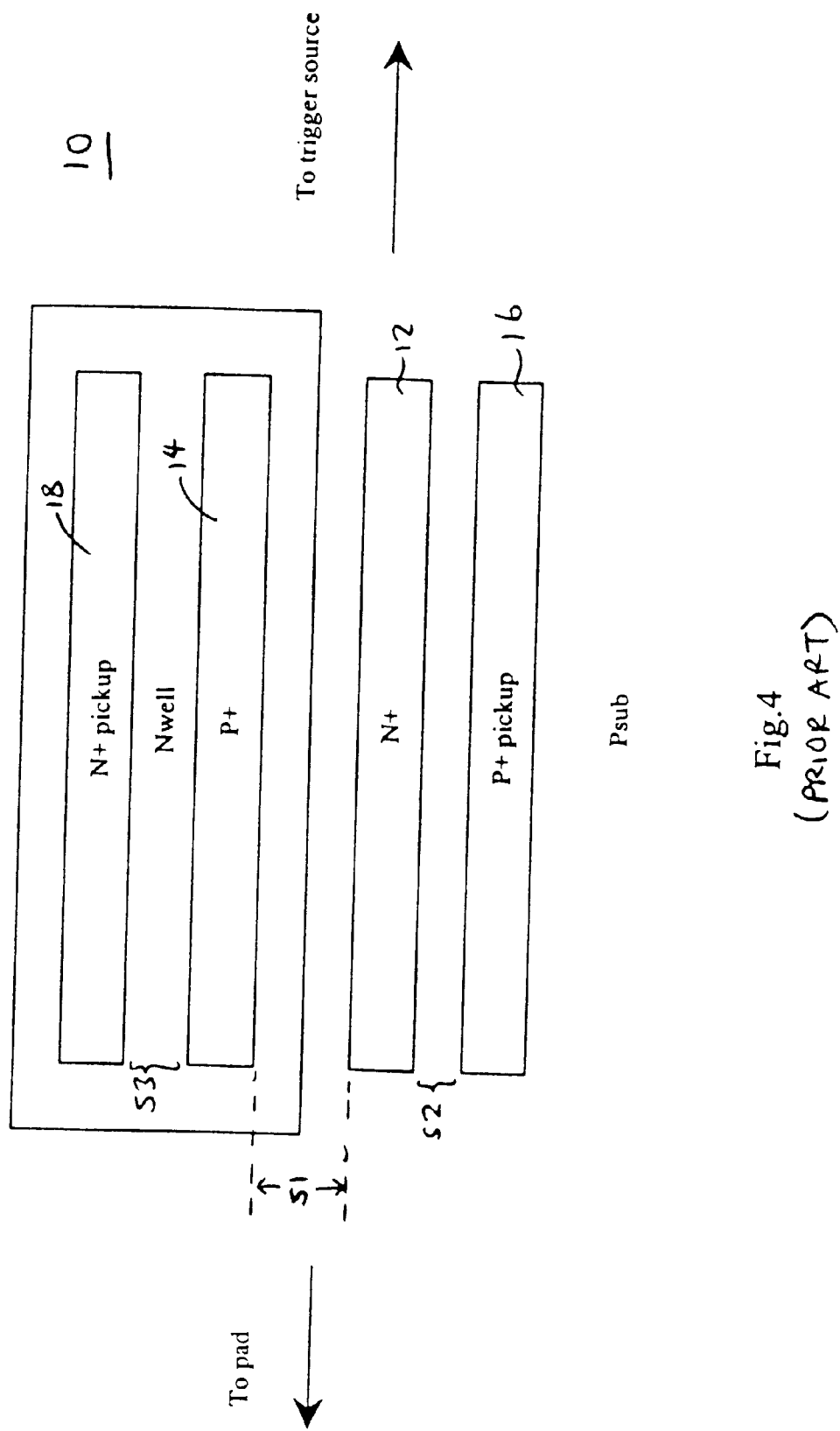
FIG. 4 is a simple layout schematic of a conventional SCR cell structure used as an ESD protective device.

To better understand the principles of the present invention, reference should first be made to FIG. 4, which is a simple schematic of a conventional SCR cell structure 10 used as an ESD protective device. As shown in FIG. 4, the Psub and Nwell regions of the conventional SCR cell 10 are each provided with one corresponding N+ block 12 and P+ block 14, respectively. The N+ block 12 and the P+ block 14 are spaced apart by a consistent spacing S1 throughout their respective lengths. The N+ block 12 has a corresponding Psub pickup 16 that is also spaced from the N+ block 12 by a consistent spacing S2 throughout their respective lengths, and the Psub pickup 16 has the same shape as the N+ block 12. Similarly, the P+ block 14 has a corresponding Nwell pickup 18 that is also spaced from the P+ block 14 by a consistent spacing S3 throughout their respective lengths, and the Nwell pickup 18 has the same shape as the P+ block 14.

Figure 5:
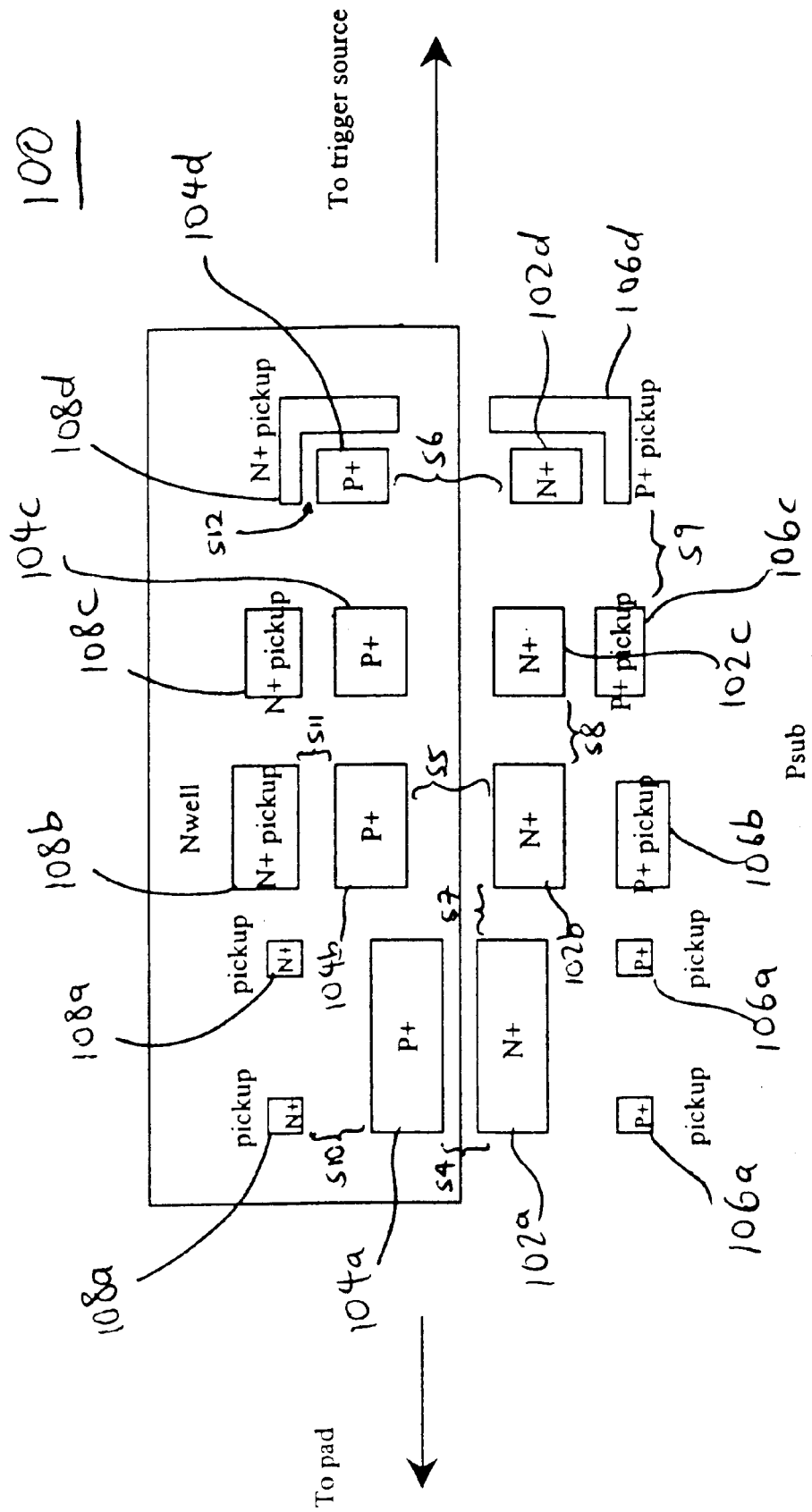
FIG. 5 is a layout schematic of an SCR cell structure used as an ESD protective device according to one embodiment of the present invention.

Referring now to FIG. 5, the SCR cell structure 100 according to one embodiment of the present invention has a plurality of N+ blocks 102a, 102b, 102c, 102d in the Psub region, and a plurality of P+ blocks 104a, 104b, 104c, 104d in the Nwell region. N+ block 102a is closest to the bonding pad, N+ block 102d is closest to the unwanted trigger sources (and furthest from the bonding pad), and the N+ blocks 102b and 102c are intermediate between the N+ blocks 102a and 102d. Similarly, P+ block 104a is closest to the bonding pad, P+ block 104d is closest to the unwanted trigger sources, and the P+ blocks 104b and 104c are intermediate between the P+ blocks 104a and 104d. Each of these blocks 102a–102d and 104a–d can be configured, positioned and spaced apart according to the desired application by the circuit designer, employing the following basic principles of the present invention:

1. The corresponding N+ and P+ blocks 102, 104 that are closer to the bonding pad are spaced more closely apart to enable latchup to occur more easily (i.e., it is desired to have the ESD protection turn on more easily).

2. The corresponding N+ and P+ blocks 102, 104 that are closer to the other parts of the circuit (labeled as the "trigger source" in FIG. 5) are spaced further apart to minimize latchup occuring due to non-ESD events (i.e., unwanted trigger sources) from the other parts of the circuit.

3. The distance or spacing between adjacent N+ blocks 102 and P+ blocks 104 is smaller for the blocks 102, 104 that are closer to the bonding pad.

4. The distance or spacing between adjacent N+ blocks 102 and P+ blocks 104 is greater for the blocks 102, 104 that are closer to the unwanted trigger sources, in order to minimize mutual induction of latchup. In other words, it is desired to prevent an accidental latchup at, for example, the P+ block 104d to cause adjacent P+ block 104c from latching up.

5. The corresponding N+ and P+ blocks 102, 104 that are closer to the bonding pad are sized larger.

6. The corresponding N+ and P+ blocks 102, 104 that are closer to the unwanted trigger sources are sized smaller.

Regarding principles 5 and 6, the length and size of an N+ or P+ block 102, 104 will determine the ESD power delivering limit. In other words, a longer or larger block size can carry more ESD power, while a shorter or smaller block size will carry less ESD power. Therefore, larger-sized blocks 102, 104 carry more latchup current and can induce neighboring blocks 102, 104 into further mutual induction of latchup.

The underlying idea behind the above-described principles is to adjust or adapt the circuit design to the directions and characteristics of suspectable trigger sources, so as to minimize latchup caused by non-ESD events while encouraging latchup to occur when an ESD event occurs. In other words, the location, spacing and sizes of the N+ and P+ blocks 102 and 104 (and the pickups 106 and 108 described below) depend on whether and where latchup is desired, and on the tolerance to trigger latchup.

The above principles are illustrated in FIG. 5. For example, the spacing S4 between the N+ block 102a and P+ block 104a is smaller than the spacing S5 between intermediate N+ blocks 102b, 102c and P+ blocks 104b, 104c, and the spacings S4 and S5 are smaller than the spacing S6 between the N+ block 102d and P+ block 104d. Similarly, the sizes of the N+ block 102a and P+ block 104a are larger than the sizes of the intermediate N+ blocks 102b, 102c and P+ blocks 104b, 104c, and the sizes of blocks 102a–102c and 104a–104c are larger than the sizes of the N+ block 102d and P+ block 104d. Similarly, the spacing S7 between the N+ blocks 102a and 102b, and P+ blocks 104a and 104b, is smaller than the spacing S8 between the intermediate N+ blocks 102b and 102c and P+ blocks 104b and 104c, and the spacing S8 is smaller than the spacing S9 between the N+ blocks 102c and 102d, and P+ blocks 104c and 104d.

Each N+ block 102a–102d has one or more corresponding Psub pickups 106a–106d, respectively, and each P+ block 104a–104d has one or more corresponding Nwell pickups 108a–108d. For example, there are two pickups 106a and 108a for the N+ block 102a and the P+ block 104a, respectively. As with the N+ blocks 102 and P+ blocks 104, similar principles can be applied to the pickups 106 and 108:

7. The pickups 106 and 108 that are closer to the bonding pad are spaced further apart from their respective blocks 102 and 104 to enable latchup to occur more easily (i.e., it is desired to have the ESD protection turn on more easily).

8. The pickups 106 and 108 that are closer to the unwanted trigger sources are spaced closer to their respective blocks 102 and 104 to minimize latchup occuring due to non-ESD events from the internal circuit.

9. The pickups 106 and 108 that are closer to the bonding pad are sized smaller because this can allow the ESD protection to turn on more easily.

10. The pickups 106 and 108 that are closer to the unwanted trigger sources are sized larger because larger-sized pickups will reduce susceptibility to latchup.

11. The shape and configuration of the pickups 106 and 108 can be adjusted depending on the proximity to the unwanted trigger sources. For example, the pickups 106d and 108d are L-shaped to surround their corresponding N+ block 102d and P+ block 104d, respectively, to further protect against non-ESD noise.

12. The length of the pickups 106 and 108 should be longer for pickups 106 and 108 that are further from the bonding pad, and shorter for pickups 106 and 108 that are closer to the bonding pad.

13. The width of the pickups 106 and 108 should be wider for pickups 106 and 108 that are further from the bonding pad, and narrower for pickups 106 and 108 that are closer to the bonding pad.

The above principles 7–13 are also illustrated in FIG. 5. For example, the spacing S10 between the N+ block 102a and P+ block 104a and their respective pickups 106a and 108a is larger than the spacing S11 between intermediate N+ blocks 102b, 102c and P+ blocks 104b, 104c and their respective pickups 106b, 106c and 108b, 108c, and the spacings S10 and S11 are larger than the spacing S12 between the N+ block 102d and P+ block 104d and their respective pickups 106d and 108d. Similarly, the sizes of the pickups 106a and 108a closest to the bonding pad are smaller than the sizes of the intermediate pickups 106b, 106c, 108b, 108c, and the intermediate pickups 106b, 106c, 108b, 108c are smaller than the sizes of the pickups 106d and 108d that are closest to the trigger sources. Similarly, the length and width of the pickups 106a and 108a closest to the bonding pad are smaller than the length and width of the intermediate pickups 106b, 106c, 108b, 108c, and the intermediate pickups 106b, 106c, 108b, 108c have smaller lengths and widths than those of the pickups 106d and 108d that are closest to the trigger sources.

Figure 6:
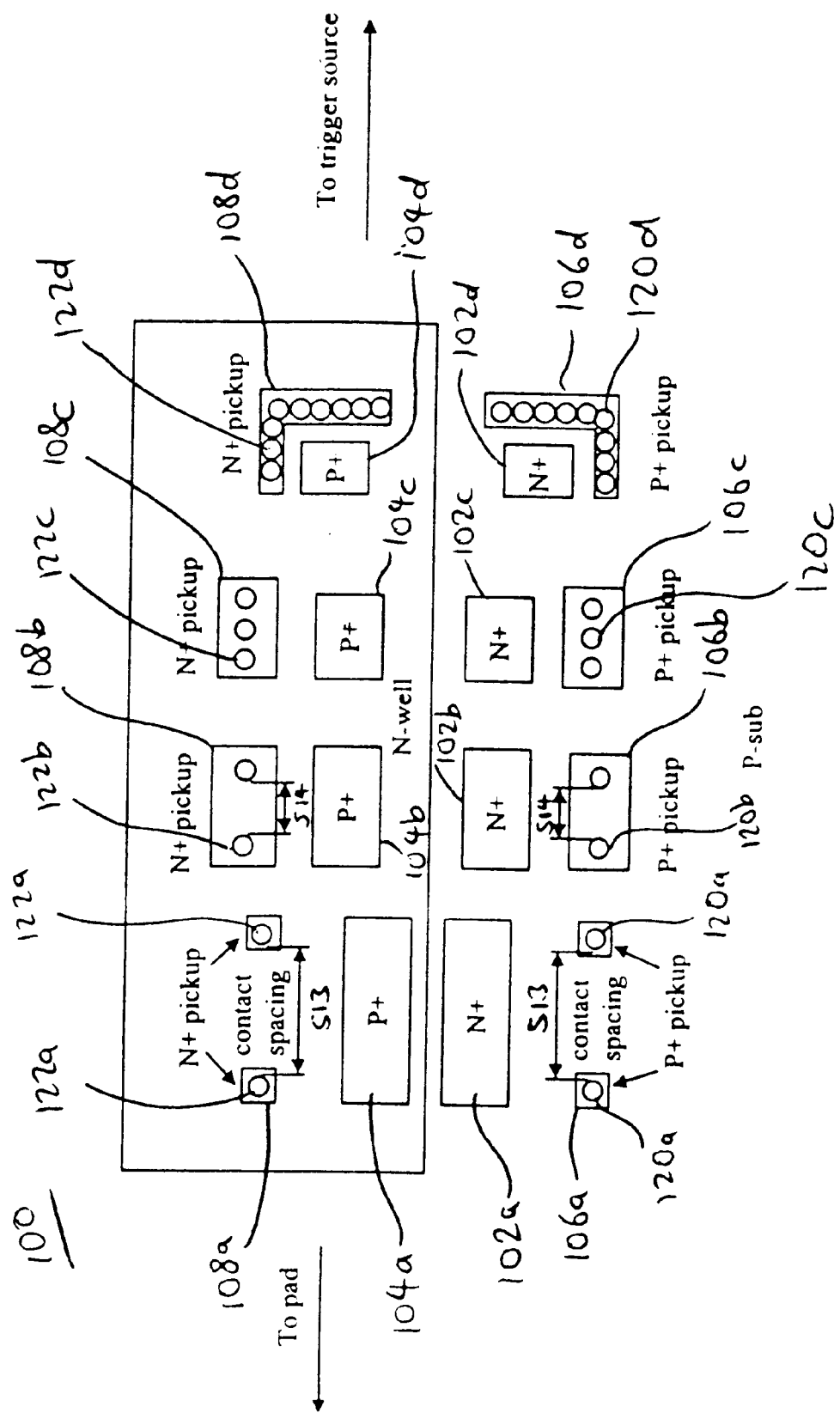
FIG. 6 is a layout schematic of the SCR cell structure of FIG. 5 illustrating the spacing between contact holes.

In addition to the possible adjustment of the spacing, sizes and locations of the N+ blocks 102, P+ blocks 104, pickups 106, 108, and the possible adjustment of the shapes of the pickups 106, 108, it is also possible to adjust the spacing between contact holes of the pickups 106, 108 in each P+/N+ group. The spacing between contact holes of the pickups 106, 108 can be smaller for P+/N+ blocks 102, 104 closer to the trigger sources, and the spacing between contact holes can be larger for P+/N+ 102, 104 blocks closer to the bonding pad. This is because a greater number or density of contact holes will reduce parasitic resistance which will make it more difficult for latchup to occur. Referring to FIG. 6, spacing S13 between the contact holes 120a and 122a of the pickups 106a and 108a, respectively, is greater than the spacing S14 between the contact holes 120b and 122b of the pickups 106b and 108b, respectively. Similarly, the spacings for the contacts 120c, 120d, 122c and 122d become progressively smaller as the pickups 106c, 106d, 108c, 108d are distanced progressively further from the bonding pad, and closer to the unwanted trigger sources.

Figure 7:
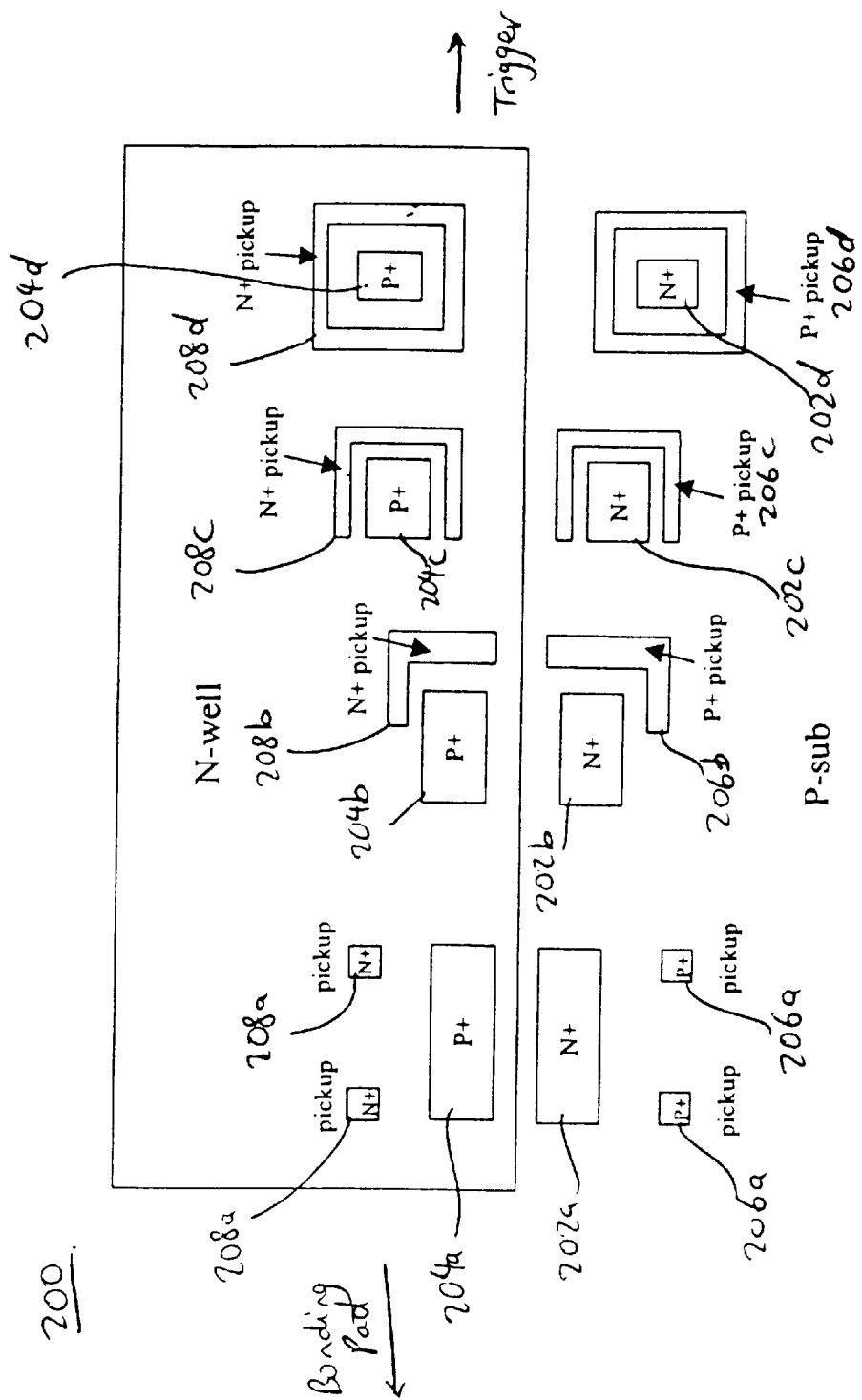
FIG. 7 is a layout schematic of an SCR cell structure used as an ESD protective device according to another embodiment of the present invention.

FIGS. 7 and 8 illustrate other examples of SCR cell structures that embody the principles set forth hereinabove. FIG. 7 illustrates another SCR cell structure 200 that is similar to that illustrated in FIG. 5 in that the spacings, sizes and locations of the N+ blocks 202a–202d and P+ blocks 204a–204d are similar to those of the N+ blocks 102a–102d and P+ blocks 104a–104d in FIG. 5. The primary difference between the SCR cell structures 100 and 200 is that the pickups 206a–206d and 208a–208d in FIG. 7 are configured differently from the pickups 16a–106d and 108a–108d of FIG. 5. In FIG. 7, some of the pickups 206b, 206c, 208b and 208c encircle additional portions of their respective N+/P+ blocks 202b, 202c, 204b, 204c. In addition, the pickups 206d and 208d completely encircle their respective N+ block 202d and P+ block 204d. As a result, the pickups 206b–206d and 208b–208d provide additional protection against latchup caused by unwanted trigger sources.

FIG. 8 illustrates that the principles of the present invention can be applied to SCR cells having arbitrary shapes. For example, the SCR cell structure 300 in FIG. 8 can have an L-shaped configuration with N+ blocks 302 and P+ blocks 304 extending along two sides 340 and 342 of the structure 300. One N+ block 302c and one P+ block 304c are L-shaped to accomodate the bend of the structure 300, and the pickup 306c corresponding to N+ block 302c is also L-shaped. Otherwise, the principles relating to the spacings, sizes and locations (and related principles) of the N+ blocks 302a–302e and P+ blocks 304a–304e are similar to those of the N+ blocks 102a–102d and P+ blocks 104a–104d in FIG. 5, and the principles relating to the spacings, sizes and locations of the pickups 306a–306e and 308a–308e are similar to those of the pickup contacts 106a–106d and 108a–108d in FIG. 5.

Thus, the principles set forth above allow the circuit designer to adjust and simultaneously optimize ESD protection performance and resistance (or immunity) to latchup.

This ability to optimize provides the flexibility of designing the SCR cells 100, 200, 300 to be more compact, and to reduce unnecessary area. In contrast, the conventional SCR cell structure 10 in FIG. 4 provides fixed spacings between the P+/N+ groups, thereby making it difficult to simultaneously optimize ESD and latchup characteristics.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A silicon controlled rectifier (SCR) device used for electrostatic discharge protection, comprising:

an N-well region on which the SCR device is provided, the N-well region having a plurality of N+ blocks and P+ blocks that are connected to an anode;

a P substrate region on which the SCR device is provided, the P substrate region having a plurality of N+ blocks and P+ blocks that are connected to an cathode;

a first group of N+/P+ blocks where the P+ block of the first group is positioned in the N-well region and the N+ block of the first group is positioned in the P substrate region, and having a first spacing between the N+ block and the P+ block of the first group;

a second group of N+/P+ blocks where the P+ block of the second group is positioned in the N-well region and the N+ block of the second group is positioned in the P substrate region, and having a second spacing between the N+ block and the P+ block of the second group;

and wherein the first spacing is smaller than the second spacing.

2. The SCR of claim 1, further including a third group of N+/P+ blocks having an N+ block and a P+ block, and a third spacing between the N+ and P+ block of the group, and wherein the second spacing is smaller than the third spacing.

3. The SCR device of claim 2, wherein each P+ block and each N+ block has a corresponding pickup, and with each adjacent pickup separated by a distance, with the distance between the pickups for the first group and the pickups from the second group being smaller than the distance between the pickups for the second group and the pickups from the third group.

4. The SCR device of claim 1, wherein each N+ and P+ block of a group has a size, and wherein the size of the N+ and P+ blocks in the first group is larger than the size of the N+ and P+ blocks in the second group.

5. The SCR device of claim 1, wherein each P+ block and each N+ block has a corresponding pickup, with the pickups for the second group being larger than the pickups for the first group.

6. The SCR device of claim 1, wherein each P+ block and each N+ block has a corresponding pickup, with the pickups for the second group having a different shape than the pickups for the first group.

7. The SCR device of claim 1, wherein each P+ block and each N+ block has a corresponding pickup, with each pickup having contacts that are separated by a distance, and with the distance between the contacts of the pickups of the first group being greater than the distance between the contacts of the pickups of the second group.

8. The SCR of claim 1, wherein the first group is closer to a bonding pad than the second group.

9. A silicon controlled rectifier (SCR) device used for electrostatic discharge protection, comprising:

an N-well region on which the SCR device is provided, the N-well region having a plurality of N+ blocks and P+ blocks that are connected to an anode;

a P substrate region on which the SCR device is provided, the P substrate region having a plurality of N+ blocks and P+ blocks that are connected to an cathode;

a first group of N+/P+ blocks where the P+ block of the first group is positioned in the N-well region and the N+ block of the first group is positioned in the P substrate region, with each of the N+ blocks and the P+ blocks of the first group having a size;

a second group of N+/P+ blocks where the P+ block of the second group is positioned in the N-well region and the N+ block of the second group is positioned in the P substrate region, with each of the N+ blocks and the P+ blocks of the second group having a size;

and wherein the size of the N+ and P+ blocks in the first group is larger than the size of the N+ and P+ blocks in the second group.

10. The SCR of claim 9, further including a third group of N+/P+ blocks having an N+ block and a P+ block, and with each of the N+ and P+ blocks of the third group having a size, and wherein the size of the N+ and P+ blocks in the second group is larger than the size of the N+ and P+ blocks in the third group.

11. The SCR device of claim 10, wherein each P+ block and each N+ block has a corresponding pickup, and with each adjacent pickup separated by a distance, with the distance between the pickups for the first group and the pickups from the second group being smaller than the distance between the pickups for the second group and the pickups from the third group.

12. The SCR device of claim 9, wherein each P+ block and each N+ block has a corresponding pickup, with the pickups for the second group being larger than the pickups for the first group.

13. The SCR device of claim 9, wherein each P+ block and each N+ block has a corresponding pickup, with the pickups for the second group having a different shape than the pickups for the first group.

14. The SCR device of claim 9, wherein each P+ block and each N+ block has a corresponding pickup, with each pickup having contacts that are separated by a distance, and with the distance between the contacts of the pickups of the first group being greater than the distance between the contacts of the pickups of the second group.

15. The SCR of claim 9, wherein the first group is closer to a bonding pad than the second group.

16. The SCR of claim 9, wherein the second group is closer to unwanted trigger sources than the first group.

17. A silicon controlled rectifier (SCR) device used for electrostatic discharge protection, comprising:

an N-well region on which the SCR device is provided, the N-well region having a plurality of N+ blocks and P+ blocks that are connected to an anode;

a P substrate region on which the SCR device is provided, the P substrate region having a plurality of N+ blocks and P+ blocks that are connected to an cathode;

a first group of N+/P+ blocks, a second group of N+/P+ blocks, and a third group of N+/P+ blocks, with each group of N+/P+ blocks having:

an N+ block and a P+ block, with each of the N+ and P+ block of the group having a size, with a distance between the N+ block and P+ block of the group;

wherein the distance for the first group is smaller than the distance for the second group; and wherein the size of the N+ and P+ blocks in the first group is larger than the size of the N+ and P+ blocks in the second group; and wherein the N+ block of the groups of N+/P+ blocks is positioned in the P substrate region, and the P+ block of the groups of N+/P+ blocks is positioned in the N-well region.

18. The SCR device of claim 17, wherein each P+ block and each N+ block has a corresponding pickup, with the pickups for the second group being larger than the pickups for the first group.

19. The SCR device of claim 18, wherein each P+ block and each N+ block has a corresponding pickup, with the pickups for the second group having a different shape than the pickups for the first group.

20. The SCR device of claim 18, wherein each P+ block and each N+ block has a corresponding pickup, with each pickup having contacts that are separated by a distance, and with the distance between the contacts of the pickups of the first group being greater than the distance between the contacts of the pickups of the second group.

* * * * *